(12) United States Patent
Loiko et al.

(10) Patent No.: US 8,766,362 B2
(45) Date of Patent: Jul. 1, 2014

(54) SHALLOW TRENCH ISOLATION FOR SOI STRUCTURES COMBINING SIDEWALL SPACER AND BOTTOM LINER

(75) Inventors: Konstantin V. Loiko, Austin, TX (US); Toni D. Van Gompel, Austin, TX (US); Rode R. Mora, Austin, TX (US); Michael D. Turner, San Antonio, TX (US); Brian A. Winstead, Austin, TX (US); Mark D. Hall, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/548,304

(22) Filed: Jul. 13, 2012

(65) Prior Publication Data
US 2012/0273889 A1    Nov. 1, 2012

Related U.S. Application Data

(62) Division of application No. 11/788,184, filed on Apr. 18, 2007, now Pat. No. 8,236,638.

(51) Int. Cl.
*H01L 27/12* (2006.01)
(52) U.S. Cl.
USPC .......................................................... 257/347
(58) Field of Classification Search
USPC ................. 438/218, 221, 294–298, 424–425;
257/347, E21.632, E27.112, E21.564
See application file for complete search history.

(56) References Cited

U.S. PATENT DOCUMENTS

| | | | |
|---|---|---|---|
| 6,194,283 | B1 | 2/2001 | Gardner et al. |
| 7,084,423 | B2 | 8/2006 | Grupp et al. |
| 2003/0087497 | A1 | 5/2003 | Yoo et al. |
| 2004/0113174 | A1 | 6/2004 | Chidambarrao |
| 2005/0026390 | A1 | 2/2005 | Chi |
| 2005/0145937 | A1 | 7/2005 | Chen et al. |
| 2005/0242403 | A1 | 11/2005 | Yeap et al. |
| 2006/0094169 | A1 | 5/2006 | White et al. |
| 2007/0020867 | A1 | 1/2007 | Ieong et al. |
| 2007/0249129 | A1 | 10/2007 | Hall et al. |
| 2008/0157216 | A1 | 7/2008 | Kim et al. |

OTHER PUBLICATIONS

Thompson, S.E. et al., "Future of Strained Si/Semiconductors in Nanoscale MOSFETs," Technical Digest, 2006 International Electron Devices Meeting, Dec. 2006, 4 pages.

*Primary Examiner* — Kevin Parendo

(57) ABSTRACT

A method for making a semiconductor device is provided which includes (a) providing a layer stack comprising a semiconductor layer (211) and a dielectric layer (209) disposed between the substrate and the semiconductor layer, (b) creating a trench (210) which extends through the semiconductor layer and which exposes a portion of the dielectric layer, the trench having a sidewall, (c) creating a spacer structure (221) which comprises a first material and which is adjacent to the sidewall of the trench, and (d) forming a stressor layer (223) which comprises a second material and which is disposed on the bottom of the trench.

19 Claims, 11 Drawing Sheets

SHALLOW TRENCH ISOLATION FOR SOI STRUCTURES COMBINING SIDEWALL SPACER AND BOTTOM LINER

CROSS-REFERENCE TO RELATED APPLICATION(S)

The present application is a divisional of U.S. patent application Ser. No. 11/788,184, entitled "SHALLOW TRENCH ISOLATION FOR SOI STRUCTURES COMBINING SIDEWALL SPACER AND BOTTOM LINER" filed on Apr. 18, 2007, now U.S. Pat. No. 8,236,638 the entirety of which is herein incorporated by reference.

FIELD OF THE DISCLOSURE

The present disclosure relates generally to semiconductor devices, and more particularly to methods for forming shallow trench isolation (STI) stressor structures in semiconductor devices to enhance their performance.

BACKGROUND OF THE DISCLOSURE

The use of semiconductor-on-insulator (SOI) wafers in making MOSFET devices has become common in the art. On an SOI wafer, a semiconductor layer is provided which is disposed over a buried oxide (BOX) layer or insulator layer. SOI MOSFET transistors offer improvements over bulk MOSFET transistors in terms of circuit speed, reductions in chip power consumption, and in channel-length scaling. These advantages arise, at least in part, from the decreased junction capacitance made possible by the presence in these devices of a dielectric layer under the active semiconductor region.

The use of a thin layer of strained silicon in the channel layer of MOSFET devices has also been found to improve the performance characteristics of these devices. The presence of strain in the channel layer causes the individual silicon atoms within that layer to be forced farther apart or closer together in their lattice structure than would be the case in the unstrained material. The larger or smaller lattice spacing results in a change in the electronic band structure of the device such that current carriers (i.e., electrons and holes) have higher mobilities within the channel layer, thereby resulting in higher currents in the transistor and faster circuit speeds.

The use of strained silicon channel layers in SOI MOSFETs combines the advantages of a strained silicon channel with the advantages attainable with MOSFET devices. Thus, in SOI MOSFETs, the presence of a buried insulator can drastically reduce parasitic capacitance, while the use of a strained silicon channel in a MOSFET device enhances the drive current of the device.

However, the use of strained silicon channels in SOI MOSFETs offers additional advantages over the use of such channels in bulk MOSFETs. Thus, in bulk MOSFETs, strained silicon channels are typically formed on a thick layer of SiGe, so the source and drain junctions are formed within the SiGe layer. Since SiGe has a lower energy gap and higher dielectric constant, this leads to higher junction capacitances and junction leakage. By contrast, when a strained silicon channel is formed in an SOI structure, the increased junction capacitance and leakage associated with SiGe are mitigated by the SOI structure, and thus are less detrimental to transistor performance.

Despite the aforementioned notable advantages of strained SOI MOSFETs, a number of challenges remain in the implementation of these devices. In particular, SOI MOSFETs frequently exhibit drive currents ($I_{dsat}$) that are lower than the values which should theoretically be obtainable. There is thus a need in the art for SOI MOSFETs with improved drive currents, and for methods of making such MOSFETs. These and other needs may be addressed by the devices and methodologies disclosed herein.

DETAILED DESCRIPTION

Figure 1:
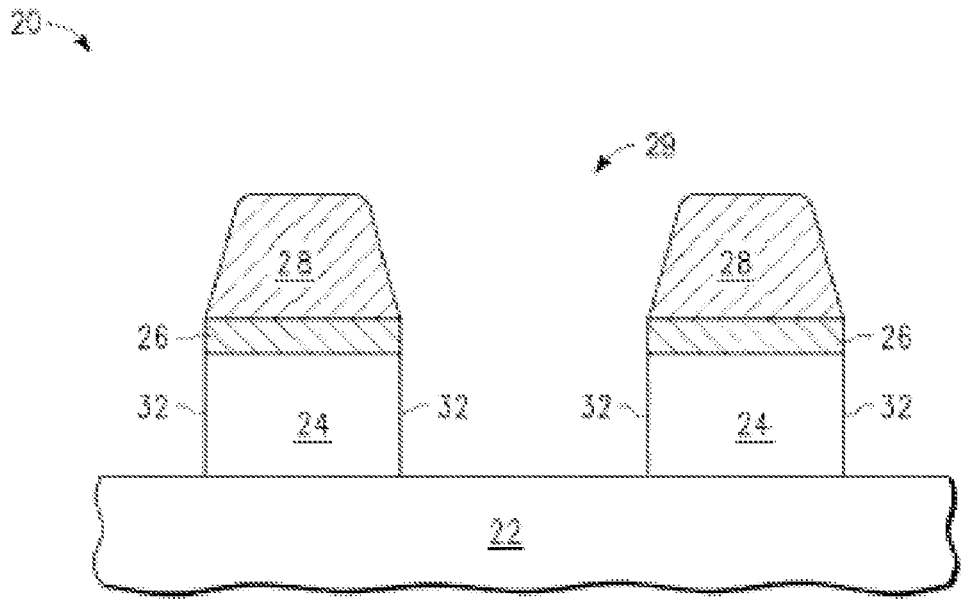
FIG. 1 is an illustration of a stage in a first prior art process for forming an STI structure on an SOI wafer.

In one aspect, a method for making a semiconductor device is provided. In accordance with the method, a layer stack is provided which comprises a semiconductor layer disposed over a dielectric layer. A trench is created which extends through the semiconductor layer and which exposes a portion of the dielectric layer, the trench having a sidewall. A spacer structure comprising a first material is created which is in contact with a sidewall of the trench, and a stressor layer comprising a second material is formed at the bottom of the trench.

In another aspect, a method for making a PMOS transistor is provided which comprises (a) providing a layer stack comprising a semiconductor layer and a dielectric layer; (b) creating a trench which extends through the semiconductor layer and which exposes a portion of the dielectric layer, the trench having a sidewall; and (c) forming a first layer of a first stressor material on the bottom of the trench; wherein the PMOS transistor has a channel region, and wherein the first layer is adapted to apply compressive stress in a direction essentially parallel to the direction of current flow in the channel region.

In yet another aspect, a method for making an NMOS transistor is provided which comprises (a) providing a layer stack comprising a semiconductor layer and a dielectric layer; (b) creating a trench which extends through the semiconductor layer and which exposes a portion of the dielectric layer, the trench having a sidewall; and (c) forming a first layer of a first stressor material on the bottom of the trench; wherein the NMOS transistor has a channel region, and wherein the first layer is adapted to apply compressive stress in a direction essentially perpendicular to the direction of current flow in the channel region.

In a further aspect, a semiconductor device is provided which comprises (a) a layer stack comprising a semiconductor layer and a dielectric layer, wherein said layer stack has a trench defined therein which has a sidewall and which extends through the semiconductor layer and exposes a portion of the dielectric layer; (b) a spacer structure adjacent to said sidewall; and (c) a first layer of a first stressor material disposed on the bottom of the trench; wherein the spacer structure comprises a second stressor material.

In still another aspect, a method for making an NMOS transistor is provided which comprises (a) providing a layer stack comprising a semiconductor layer and a dielectric layer disposed between the substrate and the semiconductor layer; (b) creating a trench which extends through the semiconductor layer and which exposes a portion of the dielectric layer, the trench having a sidewall; (c) and creating a spacer structure adjacent to the sidewall of the trench; wherein the device contains an active region having a transverse edge and a longitudinal edge, wherein the transverse edge is essentially parallel to the direction of current flow through the channel region of the device, wherein the longitudinal edge is essentially perpendicular to the direction of current flow through the channel region of the device, and wherein the spacer structure is disposed along the longitudinal and transverse edges.

In still another aspect, an NMOS transistor is provided which comprises (a) a channel region; and (b) a first stressor structure adapted to apply compressive stress to said channel region in a direction essentially perpendicular to the direction of current flow.

Without wishing to be bound by theory, it is believed that the observed reduction in drive current in SOI MOSFET devices is due, in part, to oxidation of trench isolation sidewalls. While such oxidation may be advantageous in certain regions of a MOSFET device, its presence in other areas of a MOSFET device can degrade drive current through the application of compressive stress.

It has now been found that such oxidation may be avoided by selectively covering the sidewalls of trench isolation regions in portions of an SOI MOSFET device where oxidation is not desired. The sidewalls in these regions may be covered with a protective layer that prevents such oxidation from occurring. Preferably, the protective layer is a stressor layer comprising a first stressor material, and even more preferably, the protective layer is a tensile stressor. In a particularly preferred embodiment, the protective layer may be applied as a spacer structure whose dimensions may be manipulated by controlling the duration of the etch used to define the spacer structure. In some embodiments, such a protective layer may be applied in combination with a trench liner which may comprise a second stressor material which may be the same as, or different from, the first stressor material. Of course, it will be appreciated that the spacer dimensions may also be controlled by other means, such as by controlling the thickness of the layer of deposited spacer material.

The use of a protective layer of the type described herein may, in some embodiments, result in higher drive current enhancement due to reduced oxidation of the sidewalls, lower compressive stress, and (in the case of a protective layer that is a tensile stressor) greater tensile stress. By contrast, in the absence of such sidewall coverage, drive current degradation frequently occurs. For example, in one particular type of PMOS device which was studied and in which only a bottom liner was used in the isolation trench, a drive current degradation was observed for device widths below 0.6 μm. Without wishing to be bound by theory, this result is believed to be due to reduced bird's beaking and the associated silicon lifting and higher compressive stress, occasioned by oxidation of the exposed SOI in the trench sidewall.

In various embodiments of devices made in accordance with the teachings herein, a spacer structure and/or a liner may be utilized, depending on the properties desired in the device. Preferably, a sidewall spacer with or without a bottom trench liner is utilized on the transverse side (see FIG. 20) of the active region of a PMOS transistor, and a bottom trench liner (preferably a layer of nitride disposed in a dielectric layer recess) is utilized on the longitudinal side of the active region of a PMOS transistor. For NMOS transistors, a sidewall spacer and a bottom liner are preferentially utilized on the longitudinal side of the active region, and either the same configuration is used on the transverse side of the active region (relatively lightly stressed device), or a bottom liner only is utilized on the transverse side of the active region (highly stressed device or ultra-thin body (UTB) device).

The use of two stressors formed by different processes may be advantageous in that the first stressor may be formed by a first process which deposits preferentially on horizontal surfaces of a substrate, and the second stressor may be formed by a second process which deposits preferentially on vertical surfaces of a substrate. By contrast, many prior art processes form stressor structures through a single process which may not deposit equally well on both surfaces, and thus gives rise to performance degradation.

The use of two stressors formed by different processes may also be advantageous in that, although the trench bottom liner alone may act as a compressive stressor, the sidewall spacer and bottom liner together may act as tensile stressor. The liner is placed in the dielectric layer recess in contact with the SOI corner. By contrast, trench liners typically used in the prior art are tensile stressors. Hence, in order to selectively apply compressive stress, such prior art approaches commonly rely on the formation of a gap between the sidewall and bottom liner.

Another factor that is believed to contribute to reduced MOSFET performance (and especially the performance of the component NMOS transistors) is the presence of corner effects in these devices. In particular, it has been found that, if the top corners of the isolation trenches are too sharp, a concentrated electric field will result, thus causing the occurrence of leakage current in the IC chip.

It has now been found that corner effects may be avoided or mitigated by using the aforementioned methodology to form spacer structures which cover the sidewalls of isolation trenches, and by timing the anisotropic etch used to form these spacer structures such that the uppermost portion of the trench sidewall is exposed. The exposed portion of the sidewall may then be rounded during subsequent processing to reduce its sharpness.

The methodologies described herein may be further understood in the context of the prior art process depicted in FIGS. 1-4. The structure 20 depicted in FIG. 1 is a common intermediate structure that may be utilized in the fabrication of SOI devices. In this structure, a dielectric layer 22 is disposed on a silicon wafer (not shown). A layer of active silicon 24 is disposed on the BOX layer 22, and a pad oxide layer 26 is disposed over the silicon layer 24. A layer of silicon nitride 28 is disposed over the pad oxide layer 26 to serve as a mask.

As seen in FIG. 1, the layers of active silicon 24 and pad oxide 26 have been appropriately patterned to form a trench 29 therein with opposing vertical sidewalls 32. This is typically achieved by using the silicon nitride layer 28 as a mask during the dry etching or reactive ion etching (RIE) of the silicon layer 24 and pad oxide layer 26. The silicon nitride mask 28 itself may be appropriately patterned through a suitable etching process that utilizes the pad oxide layer 26 as an etch stop layer.

Figure 2:
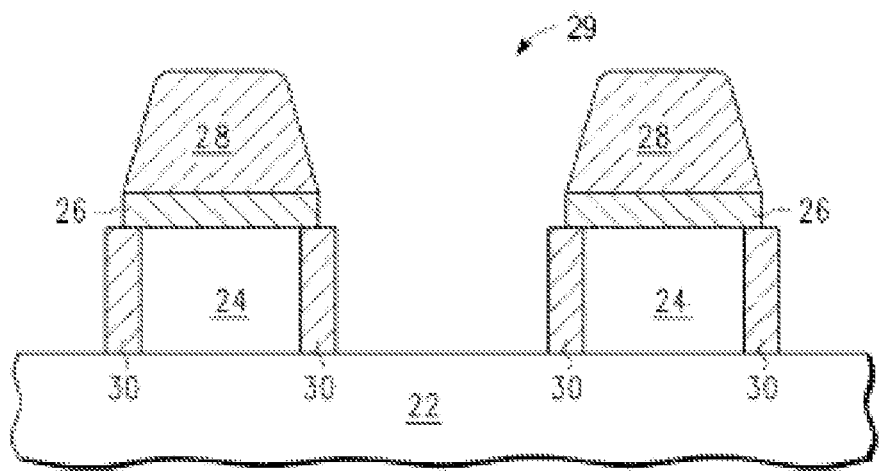
FIG. 2 is an illustration of a stage in a first prior art process for forming an STI structure on an SOI wafer.
Figure 3:
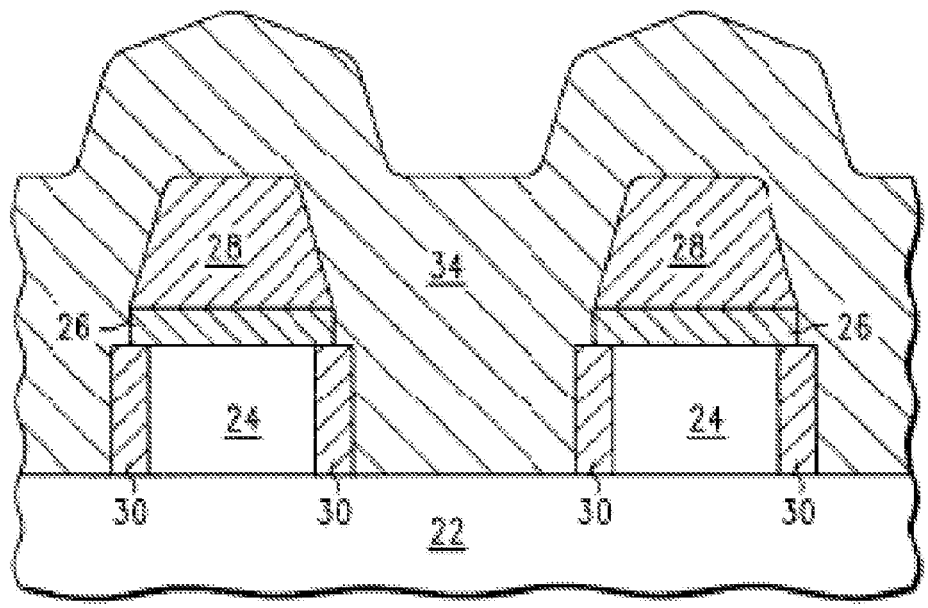
FIG. 3 is an illustration of a stage in a first prior art process for forming an STI structure on an SOI wafer.
Figure 4:
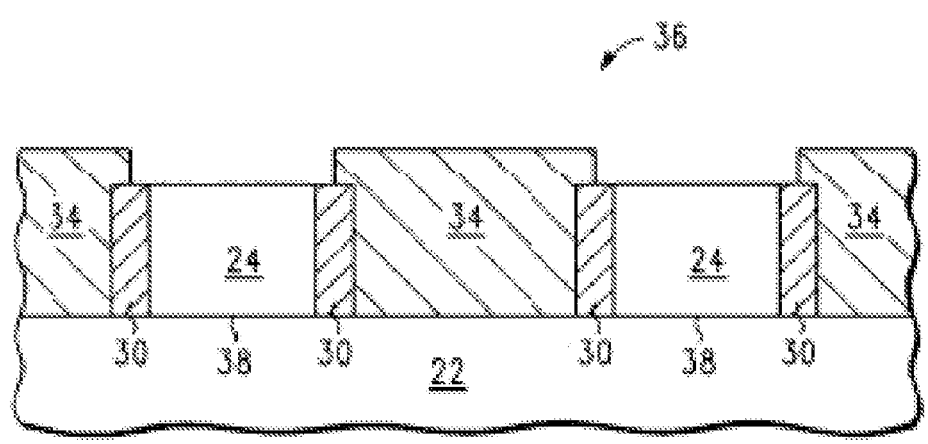
FIG. 4 is an illustration of a stage in a first prior art process for forming an STI structure on an SOI wafer.

After the active silicon layer 24 has been patterned, an oxide liner 30 may be thermally grown on the vertical sidewalls 32 of the active silicon layer 24 as shown in FIG. 2. As shown in FIG. 3, after the liners 30 have been formed, a dielectric material 34 such as silicon dioxide is deposited to fill the trench 29 (see FIG. 2) separating the patterned active silicon structures 24, thereby forming shallow trench isolation (STI) structures between the active silicon structures 24. The dielectric material 34 may be deposited using a high density plasma (HDP) deposition process. Subsequently, the nitride layer 28, the pad oxide layer 26, and a portion of the STI dielectric material 34 are removed by chemical mechanical polishing (CMP) and chemical etching to provide the patterned SOI structure 36 depicted in FIG. 4.

It has been found that the prior art process depicted in FIGS. 1-4 results in a structure in which the liner 30 exerts compressive stress on the active silicon layer 24 at the interface 38 of the active silicon layer 24 and the BOX layer 22. Typically, the stress exerted is highest at the edges of the active silicon layer 24.

Figure 5:
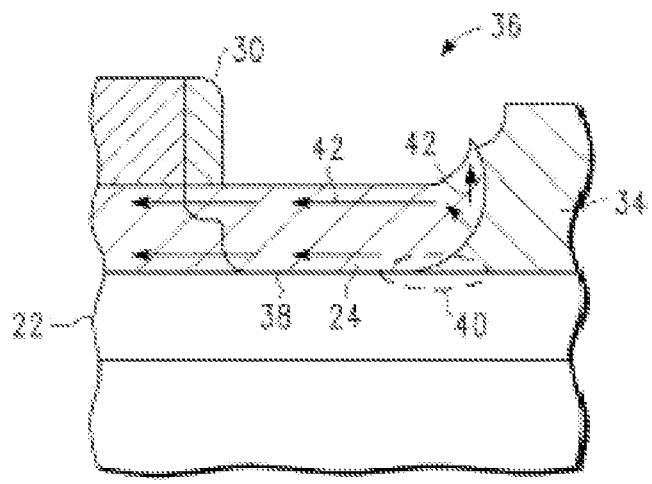
FIG. 5 is an illustration of the occurrence of a bird's beak structure in a device made in accordance with the process of FIGS. 1-4.

This stress is believed to be caused by the thermal growth process used to form the oxide liners 30. In particular, since the thermal growth of the oxide liners 30 occurs isotropically, including vertically along the sidewalls of the active silicon layer 24, as the oxide liners 30 are grown (see e.g., FIG. 2), the growth often extends into the BOX layer 22 at the interface of the active silicon layer 24 and the BOX layer 22. As shown in FIG. 5, this growth process may result in the lifting of the active silicon layer 24 at its edge and the associated formation of a "bird's beak" structure 40 of dielectric material that extends under the edge of the active silicon layer 24 at the interface 38. This bird's beak structure 40 applies strain to the active silicon layer 24, as illustrated by the arrows 42 in FIG. 5.

Various methods have been developed in the art to avoid the formation of bird's beak structures of the type depicted in FIG. 5. A typical example of such a method is the prior art process depicted in FIGS. 6-10.

Figure 6:
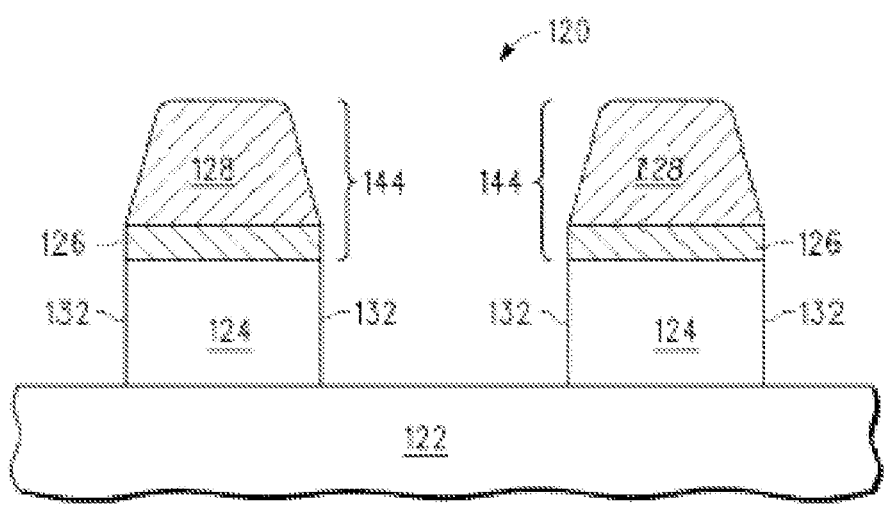
FIG. 6 is an illustration of a stage in a second prior art process for forming an STI structure on an SOI wafer.

As shown in FIG. 6, in the method depicted therein, an initial structure 120 is provided which is similar to FIG. 1, and which may be formed in a similar manner. The structure 120 has a dielectric layer 122 formed on a substrate (not shown). In one embodiment, a patterned active silicon layer 124 is formed on the buried insulator layer 122. The patterned active silicon layer 124 has a pad oxide layer 126 formed thereon, and a silicon nitride mask layer 128 formed on the pad oxide layer 126.

Figure 7:
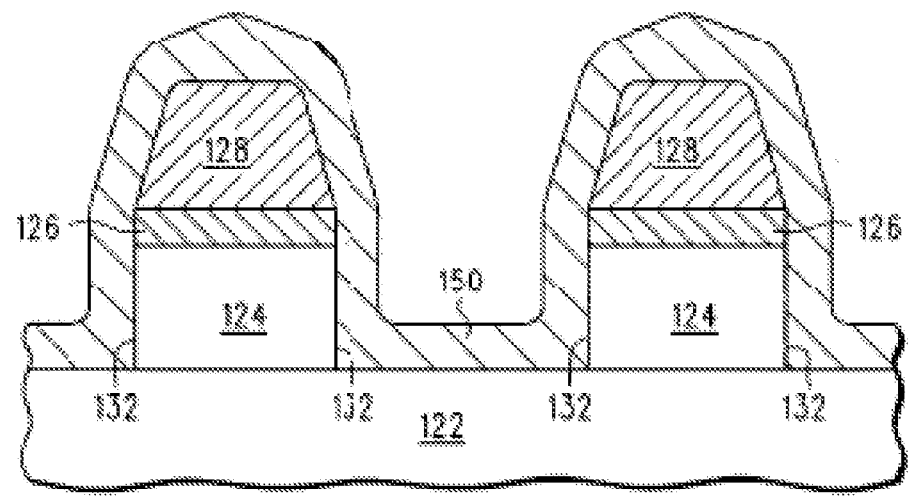
FIG. 7 is an illustration of a stage in a second prior art process for forming an STI structure on an SOI wafer.
Figure 8:
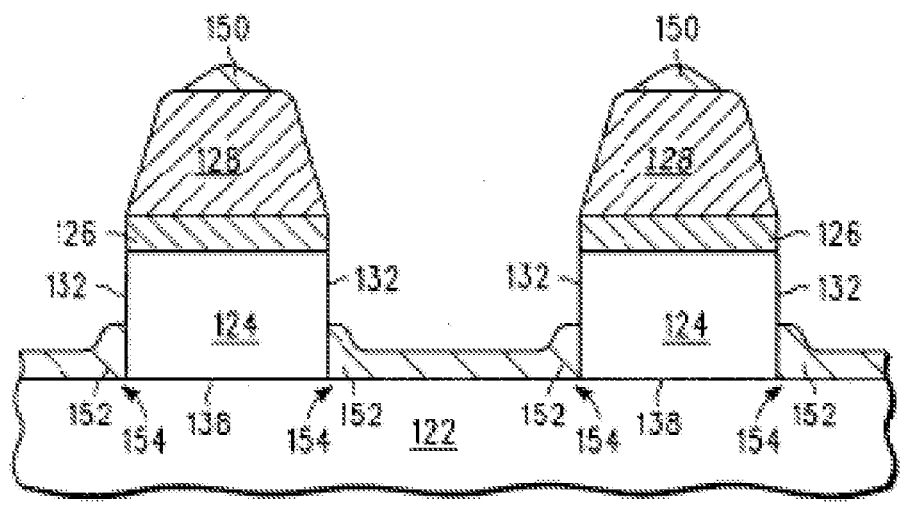
FIG. 8 is an illustration of a stage in a second prior art process for forming an STI structure on an SOI wafer.

As shown in FIG. 7, a first conformal dielectric layer 150 comprising a material such as silicon nitride is formed on the initial structure 120 of FIG. 6. Part of the first dielectric layer 150 is then removed with a wet etching process, as shown in FIG. 8. The etching step is conducted so as to remove a portion of the first dielectric layer 150 in a way that sidewall portions 132 of the patterned active silicon layer 124 become exposed, and so that remaining portions 152 of the first dielectric layer 150 cover the corners 154 of the active trench where the patterned active silicon layer 124 interfaces with the buried dielectric layer 122. The remaining portions of the first dielectric layer 150 cover a lower portion of the sidewalls 132 of the patterned active silicon layer 124 and also cover the buried insulator layer 122, as shown in FIG. 8.

Figure 9:
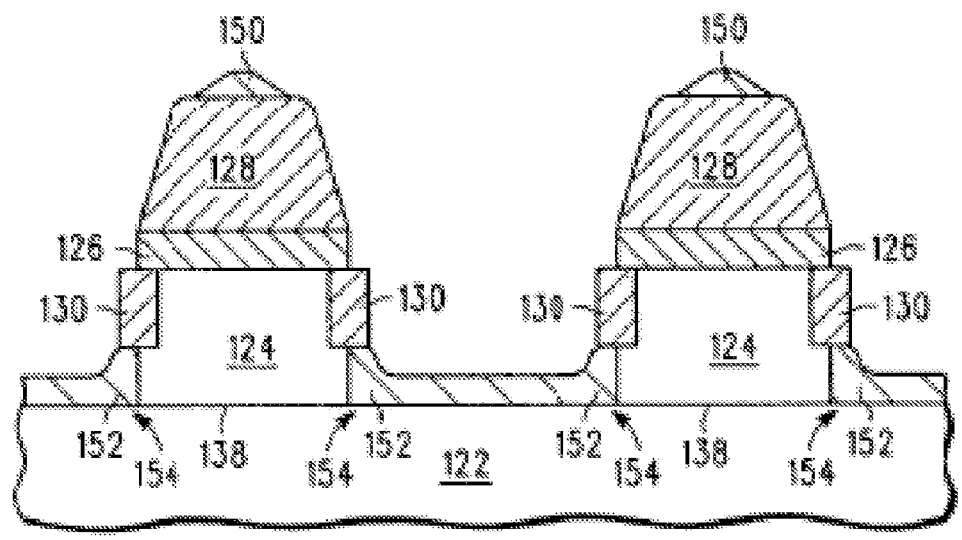
FIG. 9 is an illustration of a stage in a second prior art process for forming an STI structure on an SOI wafer.
Figure 10:
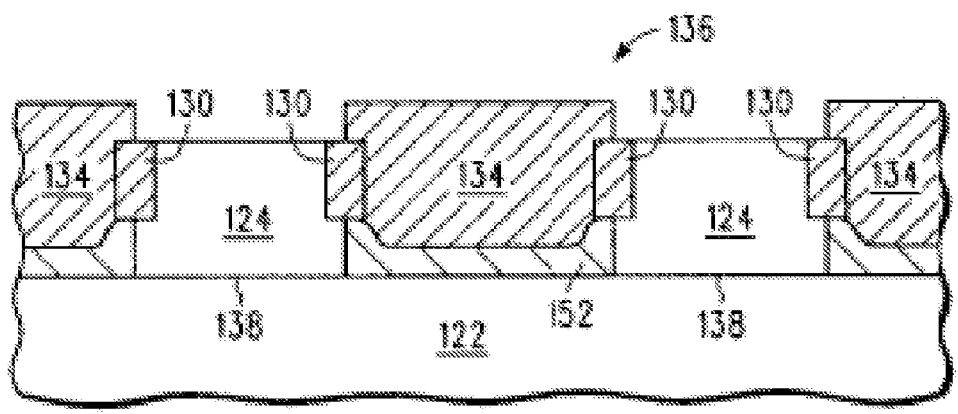
FIG. 10 is an illustration of a stage in a second prior art process for forming an STI structure on an SOI wafer.

Next, as shown in FIG. 9, an oxide liner 130 is formed on the exposed portions of the active silicon layer 124, as through thermal oxidation. Since the remaining portions 152 of the first dielectric layer 150 are disposed in the corners 154 at the interface 138 of the active silicon layer 124 and the buried insulator layer 122, the oxide liner 130 is prevented from growing down to the interface 138 of the active silicon layer 124 and the buried insulator layer 122, hence reducing or preventing the formation of bird's beak structures of the type shown in FIG. 5. Referring to FIG. 10, the regions adjacent to the patterned active silicon layer 124 are then filled with a dielectric material 134 to form the STI, and the pad oxide layer 126 and silicon nitride mask layer 128 are removed by chemical mechanical polishing and chemical etching.

While the foregoing process may have some desirable attributes, it also suffers from some notable infirmities. In particular, the conformal layer 150 used in this approach (see FIGS. 7-8) covers only the SOI/BOX corner, and leaves most of trench sidewall 132 uncovered. Hence, the exposed portion of the sidewall 132 is subject to oxidation. As noted above, such oxidation is undesirable in some portions of SOI MOSFETs, due to the compressive stress it applies and the accompanying degradation in drive current.

Figure 11:
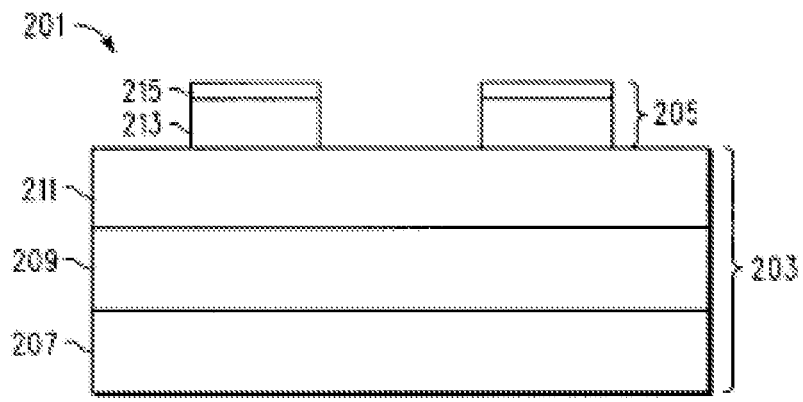
FIG. 11 is an illustration of a stage in a first process in accordance with the teachings herein for forming an STI structure on an SOI wafer.

FIGS. 11-15 illustrate a first particular, non-limiting embodiment of a fabrication process in accordance with the teachings herein. With reference to FIG. 11, a structure 201 is provided which comprises a semiconductor stack 203 having a patterned hard mask 205 disposed on a surface thereof. The semiconductor stack 203 contains a substrate 207, a Buried Oxide (BOX) layer 209 and an active semiconductor layer 211.

The semiconductor stack 203 is preferably a Semiconductor-On-Insulator (SOI) wafer which, in some embodiments, may be formed from a handle wafer and a donor wafer using methodologies well known in the art. The substrate 207 and the active semiconductor layer 211 may comprise the same or different materials, and are preferably single crystal semiconductor materials such as Si, Ge or SiGe.

The crystallographic orientation of the substrate 207 and the active semiconductor layer 211 may be the same or different. For example, the substrate 207 has a (100) orientation and the active semiconductor layer 211 has a (100) or (110) orientation. Moreover, while the semiconductor stack 203 has been depicted as having only three layers for simplicity of illustration, it will be appreciated that, in various embodiments of the methodologies and devices described herein, the semiconductor stack 203 may have various additional layers or features.

The hard mask 205 preferably comprises a nitride layer 215 and a pad oxide layer 213. The nitride layer 215 preferably comprises silicon nitride or silicon oxynitride (these may be denoted as SiN and SiON, respectively, it being understood that the actual stoichiometries of these materials may vary and are not necessarily 1:1 or 1:1:1), and the pad oxide layer 213 preferably comprises silicon oxide. The hard mask 205 may be suitably patterned using masking and etching techniques that are well known to the art. These techniques may involve a two step etching process which utilizes the pad oxide layer 213 as an etch stop layer during etching of the nitride layer 215, and which utilizes the active semiconductor layer 211 as an etch stop layer during etching of the pad oxide layer 213. Suitable photolithographic techniques may be utilized to define a photo mask for the etching of the nitride layer 215 so that an appropriate pattern may be imparted to that layer.

Figure 12:
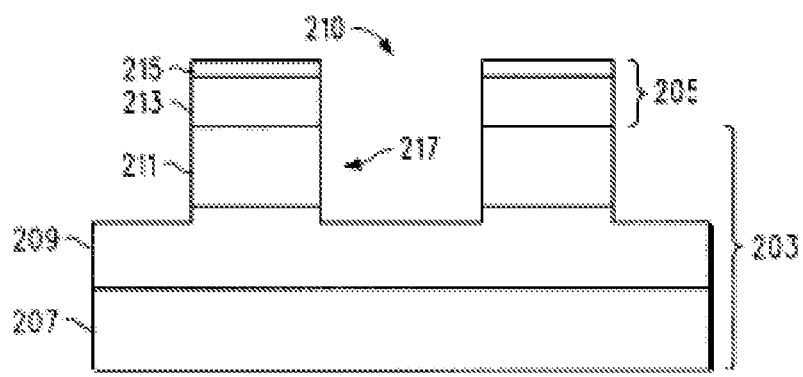
FIG. 12 is an illustration of a stage in a first process in accordance with the teachings herein for forming an STI structure on an SOI wafer.

As shown in FIG. 12, the pattern of the hard mask 205 is transferred to the active semiconductor layer 211 and the underlying BOX layer 209. This may be achieved by using the hard mask 205 as an etch mask during the dry etching or reactive ion etching (RIE) of the active semiconductor layer 211 and the BOX layer 209. The etch is preferably a timed etch and is non-selective to oxide so that only a portion of the BOX layer 209 is removed as shown. As a result of the etch, mesa structures 217 are created in the semiconductor stack 203 which are separated from each other by a trench 210.

Figure 13:
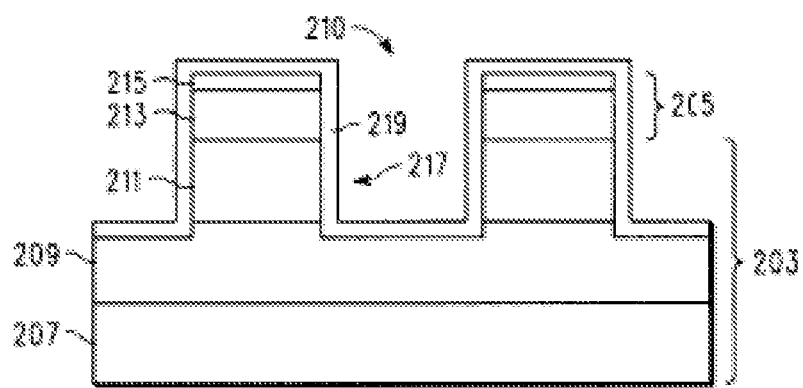
FIG. 13 is an illustration of a stage in a first process in accordance with the teachings herein for forming an STI structure on an SOI wafer.

As shown in FIG. 13, a conformal nitride layer 219 is deposited over the mesa structures 217 and the surfaces of the trench 210. The conformal nitride layer 219 preferably has a high intrinsic tensile stress. Such a layer may be formed through low pressure chemical vapor deposition (LPCVD) or plasma enhanced chemical vapor deposition (PECVD). In some embodiments, a thin layer of oxide may be deposited or formed over the structure prior to deposition of the conformal nitride layer 219.

Figure 14:
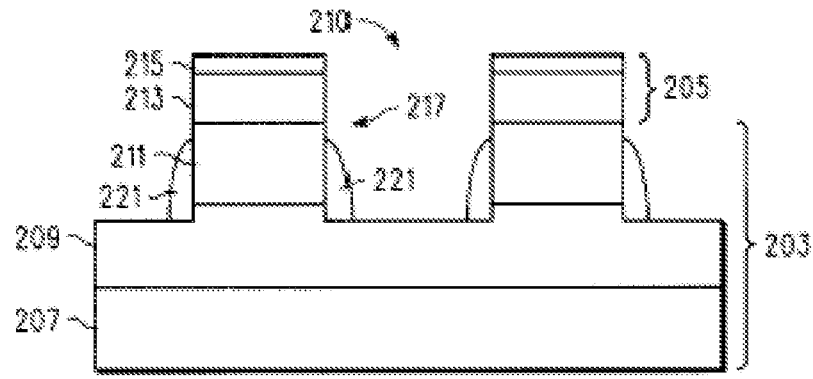
FIG. 14 is an illustration of a stage in a first process in accordance with the teachings herein for forming an STI structure on an SOI wafer.

Referring now to FIG. 14, the conformal nitride layer 219 (see FIG. 13) is subjected to an anisotropic dry etch, or to a combination of dry and wet etches, to form nitride spacers 221 adjacent to the mesa structures 217. Preferably, the height of the nitride spacers 221 is slightly less than the height of the active semiconductor layer 207 in the mesa structures 217, since this permits rounding of the top corner of the active semiconductor layer 207 during subsequent oxidations. The nitride spacers 221 protect the sidewalls of the mesa structures 217 from oxidation, thereby decreasing compressive stress in the active semiconductor layer 211 while imparting tensile stress to the active semiconductor layer 211.

Figure 15:
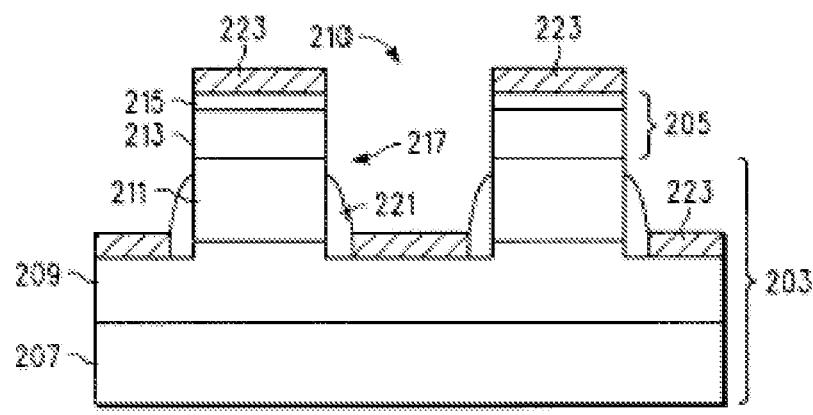
FIG. 15 is an illustration of a stage in a first process in accordance with the teachings herein for forming an STI structure on an SOI wafer.

As seen in FIG. 15, a second layer of nitride 223 is then deposited over the structure. Preferably, the second layer of nitride 223 is deposited via a directional plasma CVD process, and more preferably, via a high density plasma (HDP) deposition process. Such a process preferentially deposits nitride on the horizontal surfaces of the structure.

Figure 16:
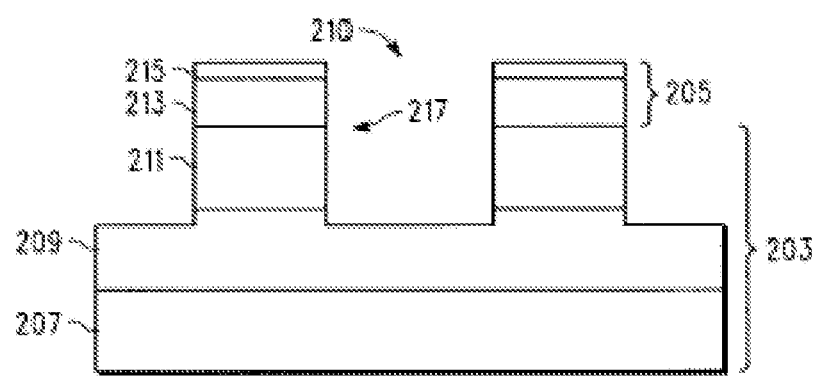
FIG. 16 is an illustration of a stage in a second process in accordance with the teachings herein for forming an STI structure on an SOI wafer.

In contrast to the process depicted in FIGS. 6-10 in which the trench liner 150 is formed by wet etch that covers only Si/BOX corner 154 and leaves most of sidewall 132 free, in the process depicted in FIGS. 12-16, the sidewalls of the trench 210 are covered by a spacer 221 formed by a dry etch or combination of dry and wet etch. These spacers 221 cover the Si/BOX corner as well as most of the sidewall. As seen in FIG. 16, the top corner is not covered to permit faceting or corner rounding, thereby mitigating corner effects. Moreover, while the process depicted in FIGS. 6-10 utilizes a conformal liner 150 which is removed from the trench sidewalls 132 partly or fully using a wet etch, the process depicted in FIGS. 11-15 utilizes a non-conformal liner deposition which covers the trench bottom only, and uses the spacer 221 in combination with the non-conformal liner 223 to cover the sidewalls of the trench 210.

Figure 17:
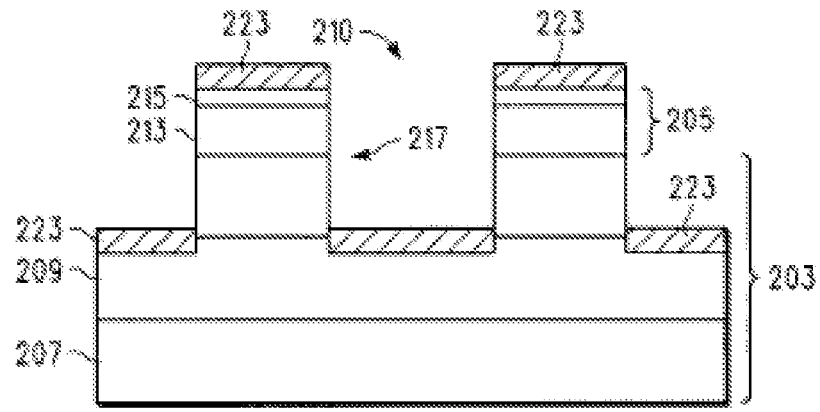
FIG. 17 is an illustration of a stage in a second process in accordance with the teachings herein for forming an STI structure on an SOI wafer.

FIGS. 16-17 illustrate a second embodiment of a process in accordance with the teachings herein. This process follows the same fabrication route illustrated in FIGS. 11-14. However, prior to depositing the nitride layer as shown in FIG. 15, the spacer structures 221 are removed through the use of a suitable photo mask and etch as shown in FIG. 16. The second layer of nitride 223 is then deposited over the structure as shown in FIG. 17.

Figure 20:
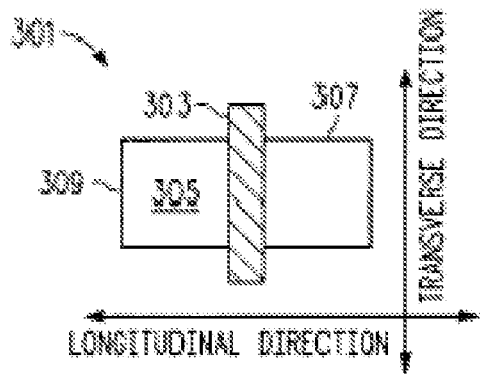
FIG. 20 is an illustration of the directionality used in reference to the description of strain in devices made in accordance with the teachings herein.

The structure shown in FIG. 17 is particularly useful in the longitudinal direction (that is, parallel to the transverse side of the active area) of PMOS devices, and in the transverse direction (that is, parallel to the longitudinal side of the active area) of NMOS devices which are highly stressed or have ultra-thin bodies. These directions are illustrated in FIG. 20 which shows a top view of a typical CMOS transistor 301 having a gate 303 and an active area 305, and wherein the active area 305 has a transverse side 307 and a longitudinal side 309. In these regions of such devices, the absence of a spacer structure permits selective sidewall oxidation, which in turn exerts a compressive stress that improves drive current. In addition, the presence of a bottom liner in the trench pins the corner of the trench and prevents semiconductor lifting, which increases the compressive stress.

Figure 18:
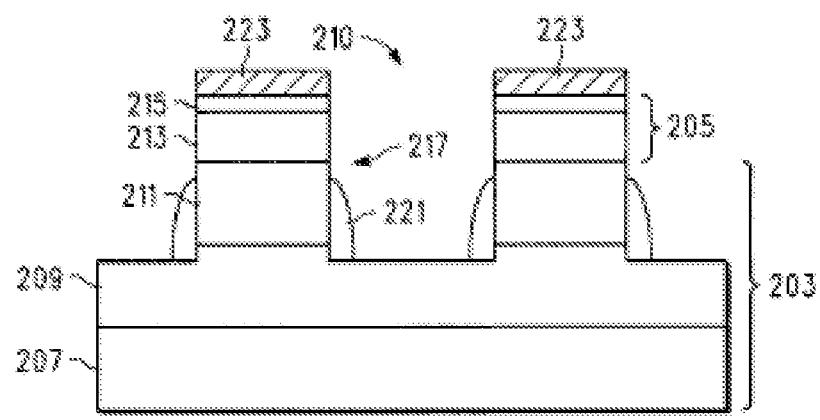
FIG. 18 is an illustration of a stage in a third process in accordance with the teachings herein for forming an STI structure on an SOI wafer.

FIG. 18 illustrates a third embodiment of a process in accordance with the teachings herein. This embodiment is essentially the same as that depicted in FIGS. 11-15. However, after the second layer of nitride 223 is deposited over the structure as shown in FIG. 15, suitable masking and etching processes are used to remove the bottom portions of the second layer of nitride 223 (that is, such that the only portion of the second layer of nitride 223 which remains is on the upper surfaces of the mesa structures 217). In some applications, particularly those involving narrow width devices, removal of the bottom portions of the second layer of nitride 223 may increase tensile stress applied to the active semiconductor layer 211.

Figure 19:
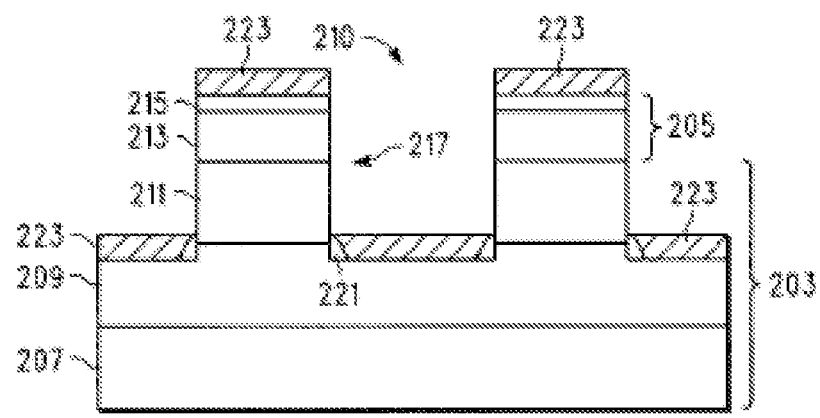
FIG. 19 is an illustration of a stage in a fourth process in accordance with the teachings herein for forming an STI structure on an SOI wafer.

FIG. 19 illustrates a fourth embodiment of a process in accordance with the teachings herein. This embodiment is essentially the same as that depicted in FIGS. 11-15. However, after the structure shown in FIG. 15 is achieved, an additional etch which preferentially etches the material of the spacer structures 221 is used to reduce the dimensions of the spacer structures 221. This approach may be used to permit selective oxidation of the sidewalls of the trench 210, to reduce the tensile stress applied to the structure by the spacer structures 221, or to adjust the cumulative stress applied by the spacer structures 221 and second layer of nitride 223 to a desired level.

Figure 21:
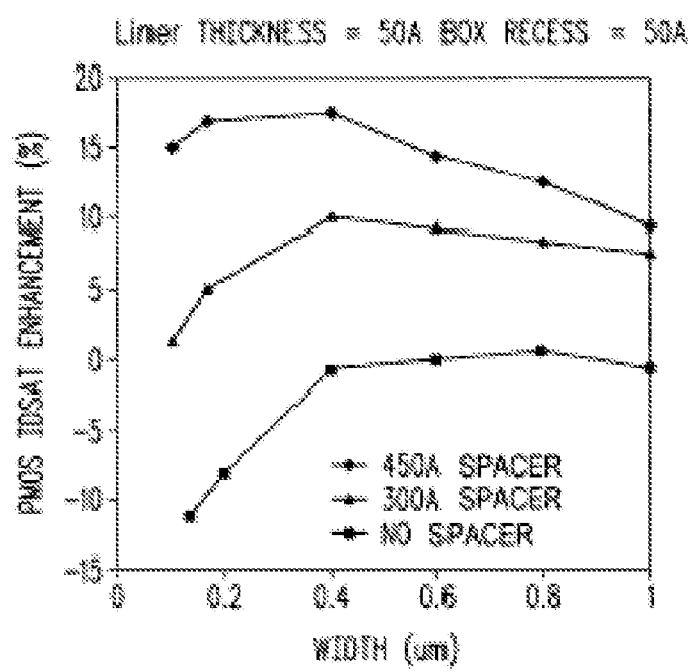
FIG. 21 is a graph of PMOS $I_{dsat}$ enhancement (in %) as a function of channel width (in μm)

FIG. 21 illustrates the effect of PMOS drive current enhancement relative to a conventional STI (FIGS. 1-4) as a function of channel width for a sidewall spacer structure of the type depicted in FIG. 15 in which the spacer comprises PECVD SiN, the trench HDP nitride liner has a thickness of 50 Å, and the BOX recess has a depth of 50 Å. The bottommost curve corresponds to the case where no sidewall spacer is used, while the middle curve corresponds to the case where a spacer having a height of 300 Å is used, and the uppermost curve corresponds to the case where a spacer having a height of 450 Å is used. As seen therein, in the particular embodiments investigated, drive current improved with the addition of a spacer, and further improved with spacer height, with the greatest improvement in drive current being achieved with a 450 Å spacer.

Figure 22:
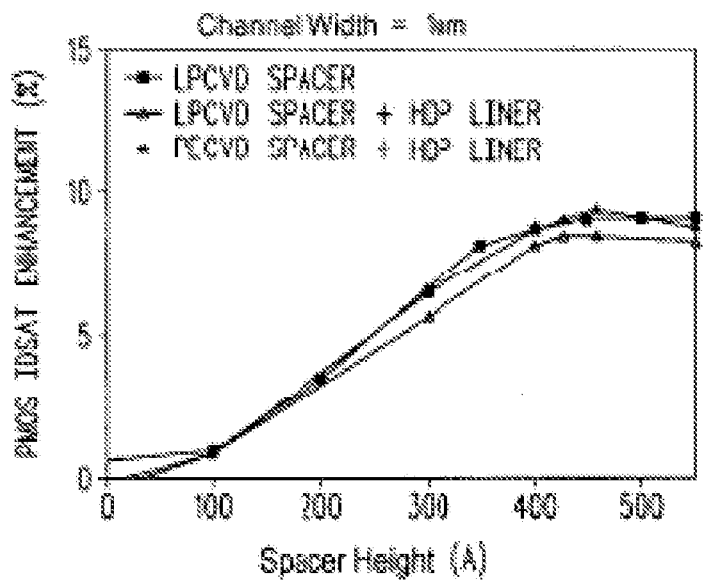
FIG. 22 is a graph of PMOS $I_{dsat}$ enhancement (in %) as a function of STI sidewall spacer height (in Å)
Figure 23:
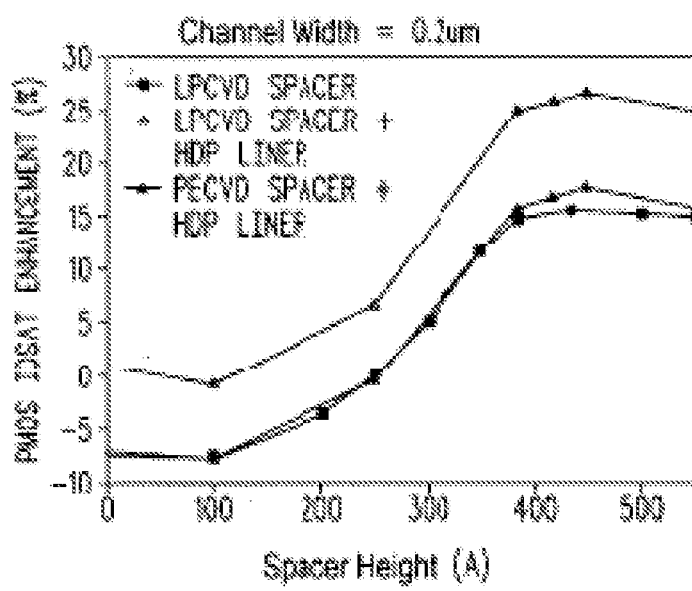
FIG. 23 is a graph of PMOS $I_{dsat}$ enhancement (in %) as a function of STI sidewall spacer height (in Å)

FIGS. 22-23 depict PMOS drive current enhancement as a function of SiN spacer height for a PMOS device having a PECVD spacer in combination with an HDP liner, an LPCVD spacer in combination with an HDP liner, and an LPCVD spacer only. FIG. 22 illustrates the case where the PMOS device has a channel width of 1 μm, while FIG. 23 illustrates the case where the PMOS device has a channel width of 0.2 μm. As seen therein, all three devices undergo an improvement in drive current as spacer height increases for devices of both channel widths. However, while the PMOS device having a 1.0 μm channel width exhibits similar results for all three configurations, in the 0.2 μm channel width device, the "LPCVD spacer only" configuration exhibits the best drive current enhancement.

Figure 24:
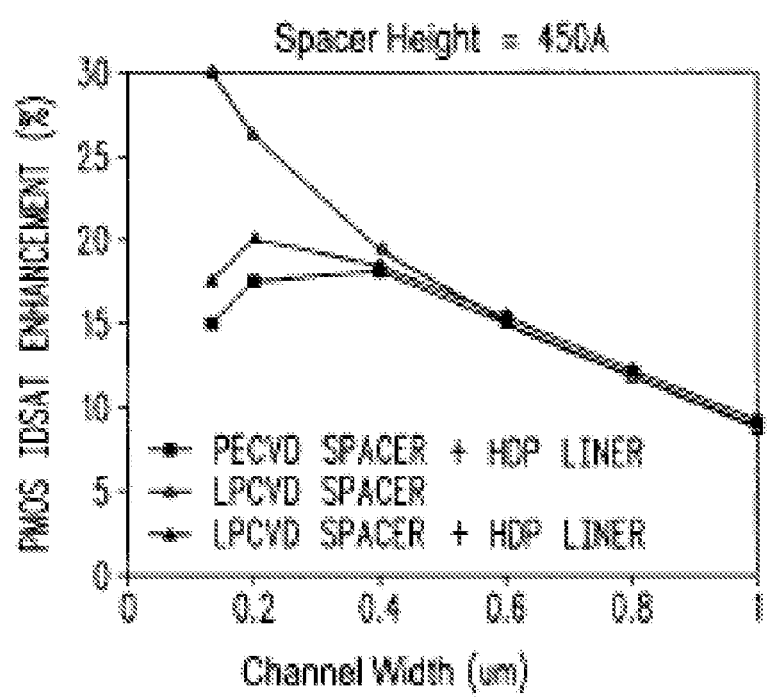
FIG. 24 is a graph of PMOS $I_{dsat}$ enhancement (in %) as a function of channel width (in μm).

FIG. 24 depicts PMOS drive current enhancement as a function of channel width for a PMOS device having a 450 Å PECVD spacer in combination with an HDP liner, a 450 Å LPCVD spacer in combination with an HDP liner, and a 450 Å LPCVD spacer only. As seen therein, the discrepancy between the three configurations increases with decreasing channel width, with the "LPCVD spacer only" configuration showing the best performance at lower channel widths.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A semiconductor device, comprising:
 a semiconductor-on-insulator layer stack comprising a semiconductor layer, a substrate and a dielectric layer disposed between the substrate and the semiconductor layer;
 a trench extending through the semiconductor layer and terminating at the dielectric layer comprising a sidewall and a bottom, wherein the bottom of the trench is defined by the dielectric layer and the sidewall comprises a first sidewall portion opposite a second sidewall portion;
 a spacer structure on the first and second sidewall portions, wherein the spacer structure comprises a first material; and
 a stressor layer, which comprises a second material, abutting a portion of the bottom of the trench between the first and second sidewall portions, wherein the first material has tensile intrinsic stress.

2. The device of claim 1, wherein the second material is distinct from the first material.

3. The device of claim 2, wherein the second material comprises at least one element selected from the group consisting of (a) silicon, (b) nitrogen, (c) oxygen, and; (d) hydrogen.

4. The device of claim 1, wherein the second material comprises at least one element selected from the group consisting of (a) silicon, (b) nitrogen, (c) oxygen, and; (d) hydrogen.

5. The device of claim 4, wherein the first material comprises nitrogen.

6. The device of claim 1, wherein the spacer structure is conformal to the sidewall of the trench.

7. The device of claim 6, wherein a top of the spacer structure is below a surface of the semiconductor layer.

8. The device of claim 7, wherein the trench extends into the dielectric layer.

9. The device of claim 1, wherein a top of the spacer structure is below a surface of the semiconductor layer.

10. The device of claim 1, wherein the trench extends into the dielectric layer.

11. The device of claim 1, wherein the semiconductor device is a CMOS device comprising a PMOS region, wherein the PMOS region contains an active region surrounded by the trench, wherein the spacer structure is adjacent to the sidewall of the trench, wherein the active region has a transverse edge which is essentially parallel to a direction of current flow through a channel region of the device, wherein the active region has a longitudinal edge which is essentially perpendicular to the direction of current flow through the channel region of the device.

12. The device of claim 1, wherein the semiconductor device is a CMOS device comprising a NMOS region, wherein the NMOS region contains an active region which is surrounded by the trench, wherein the spacer structure is adjacent to a sidewall of the trench, wherein the active region has a transverse edge which is essentially parallel to a direction of current flow through a channel region of the device, wherein the active region has a longitudinal edge which is essentially perpendicular to the direction of current flow through the channel region of the device.

13. The device of claim 1, wherein the semiconductor device is a CMOS device comprising an NMOS region, wherein the NMOS region contains an active region, and wherein the trench surrounds the active region.

14. The device of claim 1, wherein the first and second sidewall portions are disposed in corners of the trench.

15. The device of claim 1, wherein the spacer structure abuts the bottom of the trench.

16. The device of claim 1, wherein the first material is entirely within the trench.

17. The device of claim 1, wherein first material abuts the semiconductor layer and is non-oxidizing relative to the material of the semiconductor layer.

18. The device of claim 1, wherein the second material comprise nitrogen.

19. The device of claim 1, wherein the first material comprises nitrogen.

* * * * *